United States Patent [19]

Ragsdale

[11] Patent Number: 4,878,008
[45] Date of Patent: Oct. 31, 1989

[54] CONTOUR-CLAMPED HOMOGENEOUS ELECTRIC FIELD GENERATOR

[75] Inventor: Charles W. Ragsdale, Concord, Calif.

[73] Assignee: Bio-Rad Laboratories, Inc., Richmond, Calif.

[21] Appl. No.: 184,514

[22] Filed: Apr. 21, 1988

[51] Int. Cl.⁴ ............................................... G05F 1/46
[52] U.S. Cl. ..................................... 323/271; 323/284
[58] Field of Search ............... 323/282, 284, 285, 286, 323/287, 288, 268, 271, 272

[56] References Cited

U.S. PATENT DOCUMENTS

| | | | |
|---|---|---|---|
| 4,276,586 | 6/1981 | Boekhorst | 323/288 |
| 4,415,790 | 11/1983 | Diesch et al. | 323/280 |
| 4,683,415 | 7/1987 | Zimmerman | 323/282 |

Primary Examiner—Peter S. Wong
Attorney, Agent, or Firm—Townsend and Townsend

[57] ABSTRACT

A contour-clamped homogeneous electric field generator having a plurality of electrodes, each electrode being connected to a node which is maintained at a prescribed electrical potential. The electrical potential at the node is maintained by sourcing current into or sinking current away from the node when the voltage at the node varies. The current source comprises a first transistor having an input terminal connected to a voltage/current supply and an output terminal connected to the node. The current sink comprises a second transistor having an input terminal coupled to the node, and an output terminal coupled to the voltage/current supply ground. To control the operation of the first and second transistors, a comparator is coupled to the node for comparing a node-derived voltage to a reference voltage and for providing an oscillating pulse train in response thereto. The duty cycle of the pulse train varies in response to node voltage variation. The oscillating output of the comparator is communicated to an RC circuit which averages the voltages of the pulse train, and the averaged voltage is communicated to a control terminal of the second transistor. When the duty cycle of the pulse train increases, the increased average voltage turns on the second transistor for sinking current away from the node. When the duty cycle of the pulse train decreases, the first transistor turns on for injecting current into the node. The first and second transistors thus maintain the voltage at the prescribed level.

57 Claims, 3 Drawing Sheets

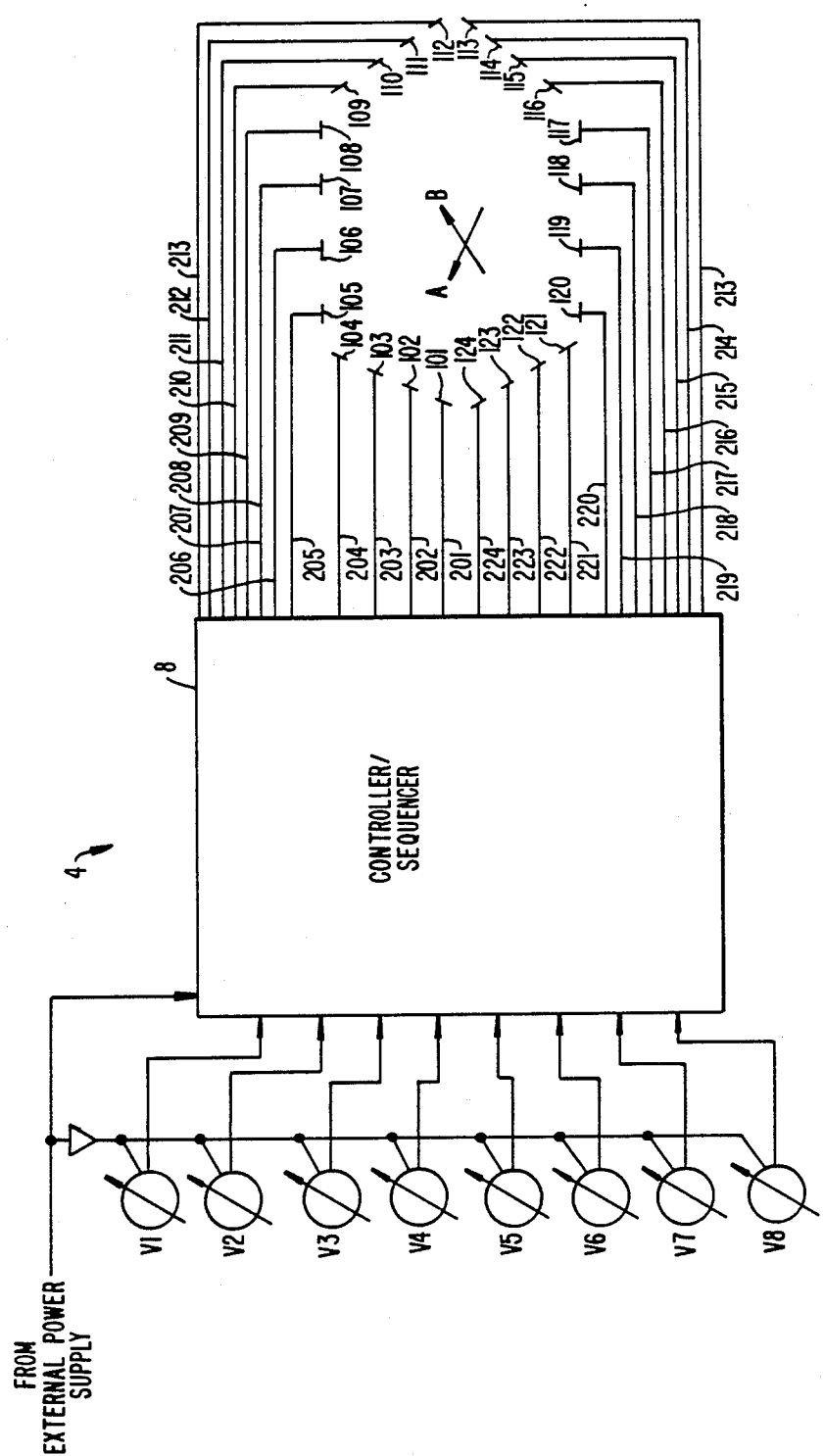
FIG._1.

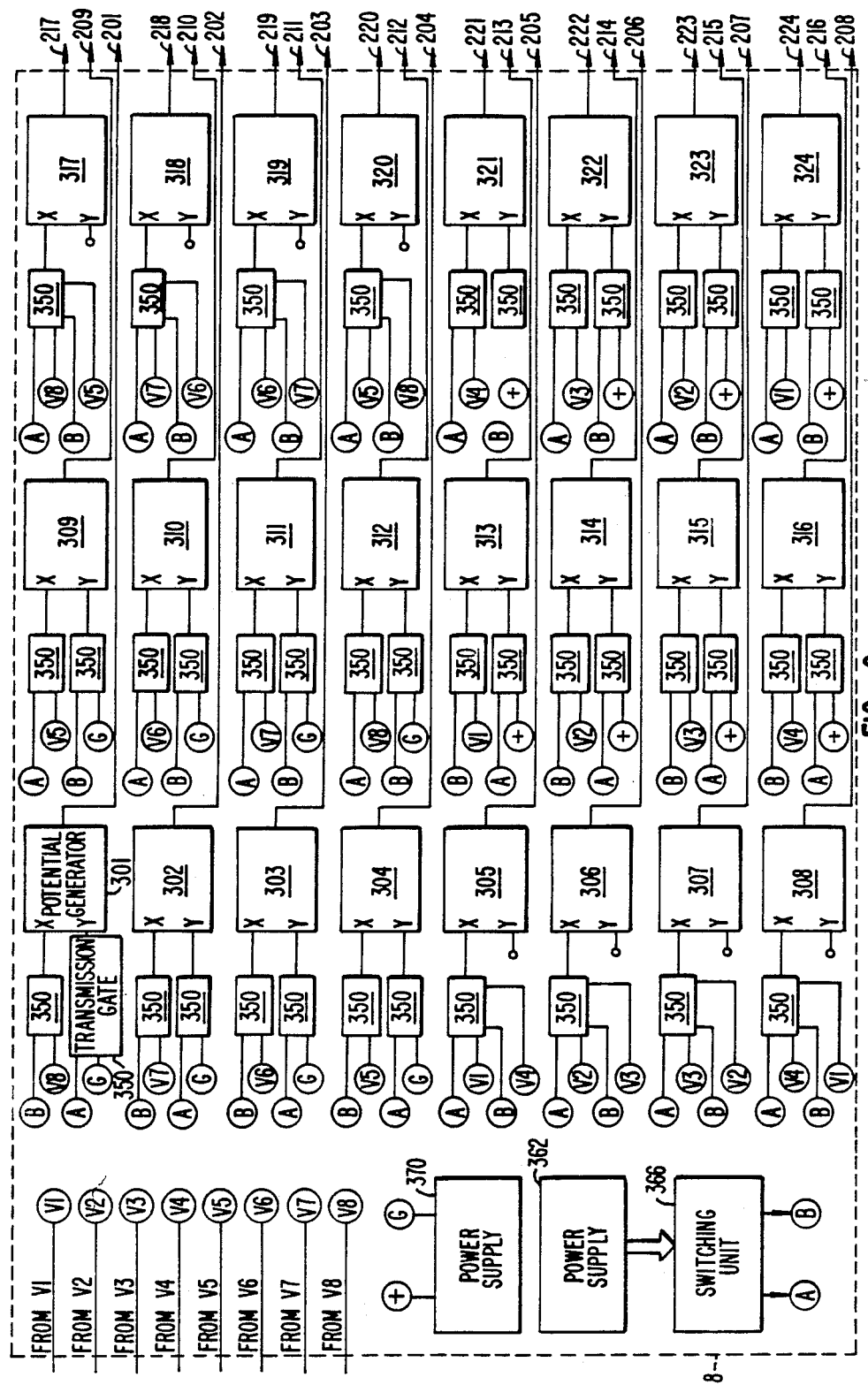
FIG._2.

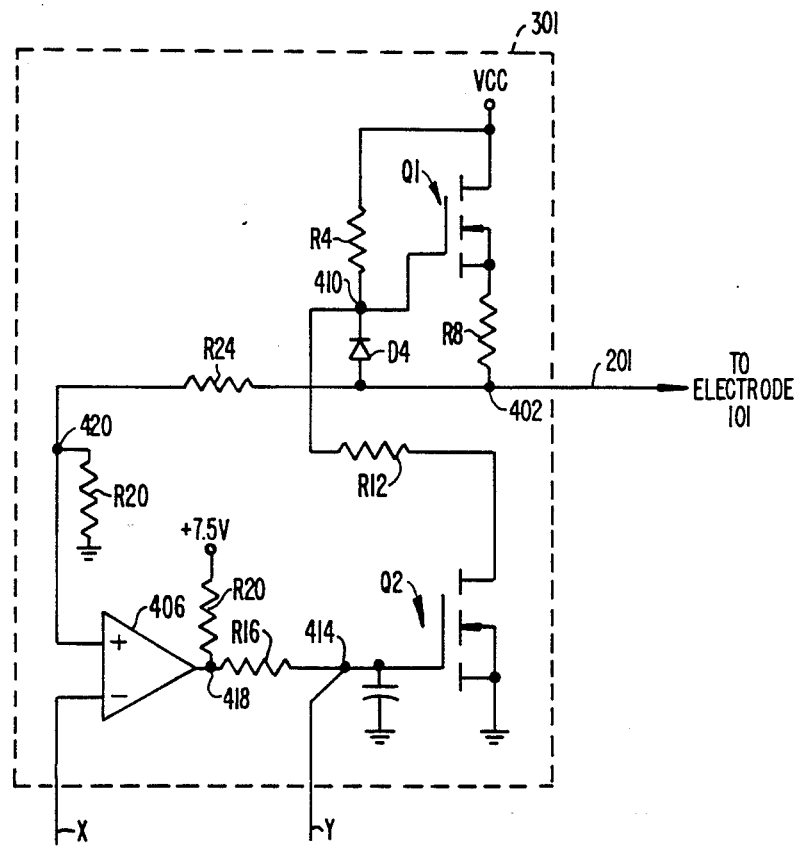
FIG._3.

CONTOUR-CLAMPED HOMOGENEOUS ELECTRIC FIELD GENERATOR

BACKGROUND OF THE INVENTION

1. Field Of The Invention

This invention relates to electrical devices used in gel electrophoresis and, more particularly, to a circuit for generating a contour-clamped homogeneous electric field that alternates between two orientations.

2. Description Of The Relevant Art

Gel electrophoresis is a known technique for separating macromolecules on the basis of size, charge, or conformation. In practice, a gel containing the macromolecules to be separated is placed within an electric field, and the macromolecules migrate through the gel in response to the field. In earlier systems, the electric field typically was generated by using a single pair of electrodes. However, unless the electric field direction was varied, large molecules (e.g. DNA) would move at the same rate as smaller molecules (a process called reptation). Furthermore, the size of molecules which may be separated are limited when only two electrodes are used.

One attempt to overcome the foregoing limitations includes providing electrode configurations that generate electric fields in alternating orientations. While this solution may increase the size of macromolecules that may be separated, it creates another problem in that the induced electric field is not uniform throughout the gel as a result of gel and buffer load down, and the macromolecules migrate through the gel with a mobility and trajectory that depend on where in the gel the samples are loaded.

The foregoing problems may be overcome by applying to the gel a homogeneous electric field that alternates between two orientations. A homogeneous electric field theoretically is generated by two parallel, infinitely long electrodes. If one electrode is located along the X axis (Y=O), and the other is separated by a fixed distance (Y=A), the potential field between the electrodes is $E(XY)=E_O Y/A$, where $E_O$ is the voltage applied across the electrodes.

To simulate a homogeneous electric field with a finite system, a plurality of electrodes are arranged in a cartesian plane along a polygonal contour, such as a square or hexagon. The axes designated Y=O and Y=A are aligned with electrodes which are arranged along parallel sides of the polygon. The electrodes along Y=O and Y=A are clamped to the potentials O and $E_O$, respectively. The remaining electrodes, located at intermediate positions of the polygon, are clamped to intermediate potentials determined by $E_Y=E_O Y/A$. Thus, positions along the contour are clamped to potentials equal to those generated by two infinitely long electrodes, and the potential field everywhere inside the contour is also equal to that generated by two infinitely long electrodes. An electric field generated in this manner is termed a "contour-clamped homogeneous electric field" (CHEF).

Alternation in the orientation of the electric field is achieved by electronic switching. For example, a square array may generate a reorientation in the electric field of 90°, while a hexagonal array may generate reorientation angles of either 120° or 60°, depending on the placement of the gel with respect to the hexagon and the assignment of polarity to the electrodes.

One method used to clamp the intermediate electrodes to the desired voltage is to dispose a series of resistors between the electrodes to, in effect, form a voltage divider having multiple nodes from Y=O to Y=A. Each electrode is connected to a node. However, a disadvantage of using a resistor array to set voltages is that voltages at each of the nodes is dependent on variations in resistor values and the error that is inherent in equally valued resistors. Furthermore, currents which flow from and into each node change the node potential unless the current in the resistor is made much larger than the nodal current. This is wasteful and results in inordinate power dissipation.

Another proposed method for establishing node voltages, not necessarily in the prior art, is to drive each electrode individually with drivers constructed from operational amplifiers. However, some electrophoresis applications require voltages of 300 volts or more, and known operational amplifiers have a maximum operating voltage of under 200 volts. In any event, high power operational amplifiers are very expensive, and they draw excessive current loads on the order of 0.4 amp. Thus, not only are these proposed systems expensive to build, but they are expensive to operate.

Finally, the control elements of analog devices used for direct electrode control cannot be conveniently isolated from the high voltage active devices, and this poses a safety problem, in addition to design restraints. A digital interface is needed, and this escalates the cost of the system. Consequently, an efficient, cost-effective, safe, and accurate CHEF generator having a wide operating range has not yet been devised.

SUMMARY OF THE INVENTION

The present invention is directed to a CHEF generator that alternates electric fields between two orientations. The drivers according to the present invention are accurate (typically to within 0.5%–1.0% of set voltage), are not dependent on gain or other characteristics of the active devices, easily generate at least 400-volts output, are efficient, allow for isolation between low voltage circuitry and high voltage circuitry (e.g., through optoisolators), and are inexpensive.

In one embodiment of the present invention, each electrode is connected to a node which is maintained at a prescribed electrical potential. The electrical potential at the node is maintained by sourcing current into or sinking current away from the node when the voltage at the node varies. The current source comprises a first transistor having an input terminal connected to a voltage/current supply and an output terminal connected to the node. The current sink comprises a second transistor having an input terminal coupled to the node and an output terminal coupled to the voltage/current supply ground. To control the operation of the first and second transistors, a comparator is coupled to the node for comparing a node-derived voltage to a reference voltage. The reference voltages for the intermediate electrodes are set using potentiometers. When the two inputs to the comparator are equal, the output of the comparator oscillates and produces a square wave pulse train having a prescribed duty cycle. When the voltage at the node increases above the prescribed value, the duty cycle of the pulse train increases, whereas when the node voltage falls below the prescribed voltage value, the duty cycle of the pulse train decreases.

The oscillating output of the comparator is communicated to an RC circuit which averages the voltages of the pulse train. The averaged voltage is communicated to a control terminal of the second transistor. When the duty cycle of the pulse train increases, the increased average voltage turns on the second transistor for sinking current away from the node. To control the operation of the first transistor, the input terminal of the second transistor is connected to a control terminal of the first transistor (in addition to the node). Thus, when the second transistor turns on, the voltage at the control terminal of the first transistor decreases with the node voltage for inhibiting current flow through the first transistor. On the other hand, when the second transistor turns off, the voltage to the control terminal of the first transistor may be raised sufficiently to turn on the first transistor for injecting current from the voltage/current supply into the node.

By using a comparator to control operation of the first and second transistors, current draw is limited to approximately 6 ma, so the system is efficient. The gain of the active devices is not important, as long as the active devices can source and sink current. Hence, the operating range of the circuit is considerably wider than circuits constructed with operational amplifiers. Additionally, the circuit may be constructed at at a fraction of the cost. Because of the digital output of the comparator, an optoisolator can be disposed between the output of the comparator and the high voltage elements of the circuit. This effectively isolates the low and high voltage elements of the system, thus enhancing safety and increasing flexibility.

These and other advantages of the invention will become apparent to those skilled in the art upon a reading of the following detailed description of the invention, which should be taken in conjunction with the accompanying drawings.

BRIEF DESCRIPTION OF THE DRAWINGS

FIG. 1 is a block diagram of the CHEF generator according to the present invention.

FIG. 2 is a block diagram of the controller/sequencer of FIG. 1.

FIG. 3 is a schematic diagram of one of the electrode drivers of FIG. 2.

DETAILED DESCRIPTION OF THE PREFERRED EMBODIMENTS

FIG. 1 is a block diagram of a CHEF generator 4 according to the present invention. CHEF generator 4 comprises a controller/sequencer 8 coupled to a plurality of electrodes 101-124 through a corresponding plurality of lines 201-224. Electrodes 101-124 are arranged in a closed polygon, e.g., a hexagon. In this embodiment, 24 electrodes are used, although the number of electrodes may vary according to system requirements.

In this embodiment, controller sequencer 8 electronically switches the generated electric field from the direction labeled "A" to the direction labeled "B." In any particular direction, the electrodes oriented perpendicular to the direction of the electric field and spaced apart parallel to each other are clamped to the minimum and maximum potential values, respectively, and the intermediate electrodes are at a proportional potential, depending on location. For example, when the electric field is oriented in the direction labeled "A," electrodes 101-104 are at the maximum electrical potential, whereas electrodes 113-116 are at the minimum electrical potential (e.g., ground). To generate the voltages at the intermediate electrodes (e.g., electrodes 105-112 and 117-124 for an electric field oriented in the direction labeled "A"), a series of potentiometers V1-V8 are coupled to controller sequencer 8. For an example of electrode potentials when the electric field is oriented in either the A or B direction for a sample maximum voltage of 100 volts, see Table 1. Power is supplied externally and servoes the value set by V1-V8 so that the entire Table is varied by the setting of the externally supplied power.

TABLE 1

| Electrode | Direction A (Volts) | Direction B (Volts) | Electrode | Direction A (Volts) | Direction B (Volts) |
|---|---|---|---|---|---|
| 101 | 100 | 7.25 | 113 | 0 | 92.74 |
| 102 | 100 | 19.07 | 114 | 0 | 80.91 |
| 103 | 100 | 30.9 | 115 | 0 | 69.09 |
| 104 | 100 | 42.73 | 116 | 0 | 57.25 |
| 105 | 92.74 | 57.25 | 117 | 7.25 | 42.73 |
| 106 | 80.91 | 69.09 | 118 | 19.07 | 30.9 |
| 107 | 69.09 | 80.91 | 119 | 30.9 | 19.07 |
| 108 | 57.25 | 92.74 | 120 | 42.73 | 7.25 |
| 109 | 42.73 | 100 | 121 | 52.25 | 0 |
| 110 | 30.9 | 100 | 122 | 69.09 | 0 |
| 111 | 19.07 | 100 | 123 | 80.91 | 0 |
| 112 | 7.25 | 100 | 124 | 92.74 | 0 |

FIG. 2 is a block diagram of controller/sequencer 8 of FIG. 1. As shown in FIG. 2, each line 201-224 is coupled to an associated electrical potential generator (PG) 301-324, respectively. Each electrical potential generator 301-324 has X and Y input lines, each typically coupled to an associated transmission gate 350. The Y input lines of electrical potential generators 305-308 and 317-320 are unconnected for reasons discussed below.

Controller/sequencer 8 includes a first power supply 362, which is coupled to a switching unit 366. Switching unit 366 redirects the output of power supply 362 to one of two lines labeled "A" and "B." Switching unit 366 operates to alternate the electric field generated by electrodes 101-124. That is, when switching unit 366 communicates the output from power supply 362 to line A, the electric field is oriented in the direction labeled "A" in FIG. 1, whereas when switching unit 366 directs the output of power supply 362 to line B, the electric field is oriented along the direction labeled "B" in FIG. 1. Power supply 362 may be any conventional power supply, and in this embodiment consists of a model 200/20 or 1000/500, available from Bio-Rad Laboratories, Inc., 1414 Harbour Way South, Richmond, Calif. 94804. Switching unit 366 is also readily available and may comprise a Pulsewave ™ 760 switching unit, also available from Bio-Rad Laboratories, Inc.

Controller/sequencer 8 includes a second power supply 370. Power supply 370 is a conventional power supply, which, in this embodiment, communicates a +7.5 volt potential to a terminal marked "+," and communicates a ground potential to a terminal marked "G."

The connections between potentiometers V1-V8, power supplies 366 and 370, and transmission gates 350 shall be discussed later.

FIG. 3 is a schematic diagram of electrical potential generator 301 of FIG. 2. The other electrical potential generators 302-324 are constructed in the same way. Electrical potential generator 301 generates and maintains a fixed electrical potential on line 201 in response to signals received on lines X and Y. Electrical potential generator 301 comprises a transistor Q1 for injecting current into a node 402; a transistor Q2 for flowing current away from node 402; and a comparator 406 for sensing a voltage derived from node 402 and for operating transistors Q1 and Q2 to maintain node 402, and hence line 201, at the desired potential.

Transistors Q1 and Q2 are FETs. The source terminal of transistor Q1 is connected to a voltage/current supply labeled "VCC" and to one terminal of a resistor R4. The other terminal of resistor R4 is connected to a node 410 which, in turn, is connected to the cathode of a diode D4 and to the first gate of transistor Q1. The anode of diode D4 is coupled to node 402. The second gate and drain of transistor Q1 is coupled to a resistor R8 which, in turn, is connected to node 402.

The source terminal of transistor Q2 is connected to a resistor R12 which, in turn, is connected to node 410. The first gate of transistor Q2 is connected to a node 414 between a capacitor C4 and a resistor R16. Line Y is also connected to node 414. The other terminal of capacitor C4 is coupled to ground. The other terminal of resistor R16 is coupled to an output terminal 418 of comparator 406 and to one terminal of a resistor R20. The other terminal of resistor R20 is coupled to a +7.5 volt potential. The second gate and the drain of transistor Q2 is coupled to a ground potential.

The negative input terminal of comparator 406 is connected to line X. The positive input terminal of comparator 406 is connected to a node 420 between a pair of serially connected resistors R20 and R24. The other terminal of resistor R20 is coupled to ground, whereas the other terminal of resistor R24 is coupled to node 402.

In operation, Q1 sources or injects current into node 402 when the voltage at node 402 falls below the prescribed value, and transistor Q2 sinks or flows current away from node 402 when the voltage at node 402 rises above the prescribed value. Because of diode D4, the operation of transistors Q1 and Q2 do not conflict. Whenever Q2 sinks current from node 402, flow of current is through diode D4 and from node 410, which forces transistor Q1 to be fully off. Thus, as transistor Q2 turns on, transistor Q1 is progressively switched off. Since only the amount of current needed to force node 402 to become the required voltage is used, the system is efficient.

Resistors R20 and R24 divide the voltage at node 402 to a low level. Comparator 406 compares the divided voltage at node 420 to the voltage on line X. If the voltage at node 420 is higher than the voltage on line X, a high signal appears at output terminal 418. As shall be discussed later, this tends to turn on transistor Q2, which decreases the voltage at node 402. Conversely, when the voltage at node 420 is lower than the reference voltage on line X, a low signal appears at output terminal 414. This tends to turn off transistor Q2, and hence turn on transistor Q1. Consequently, the signal at output terminal 418 of comparator 406 tends to oscillate. At the point when the positive and negative inputs of comparator 406 are balanced (i.e., when node 402 is at the prescribed value), the pulse train emitted by comparator 406 is a square wave.

Resistor R16 and capacitor C4 function to average the voltages of the pulse train appearing at output terminal 418. Thus, when the voltage at node 402 drops below the desired value, the duty cycle, and hence the average voltage, of the pulse train at node 414 increases, whereas when the voltage at node 402 rises above the desired voltage value, then the duty cycle, and hence the average voltage, of the pulse train appearing at node 414 decreases. The averaged voltages, in turn, function to selectively turn transistors Q1 and Q2 on and off. This creates a servo effect to maintain the voltage at node 402 constant.

As shown in FIG. 2, a transmission gate 350, coupled to line X of an electrical potential generator, is always coupled to either output terminal A or output terminal B of switching unit 366 and to one of potentiometers V1-V8. V1-V8 are servoed to follow the external power supply but maintain the required ratio. Each of the transmission gates selectively enables one of the signals from potentiometers V1-V8 to be communicated to the negative input terminal of comparator 406 in the associated electrical potential generator. For example, the transmission gate 350, coupled to line X of electrical potential generator 301, is coupled to line B of switching unit 366 and to potentiometer V8 for applying the voltage set by potentiometer V8 to the negative input terminal of comparator 406 in electrical potential generator 301. Thus, potentiometer V8 sets the reference voltage for comparator 406 in electrical potential generator 301, and hence potentiometer V8 controls the voltage appearing at node 402 and electrode 101 when the electric field is oriented in the B direction.

The signals appearing on line X control the voltage appearing at the intermediate electrodes, (i.e., electrodes 105-112 and 117-124 when the electric field is oriented in the A direction, and electrodes 101-108 and 113-120 when the electric field is oriented in the B direction).

A transmission gate 350, coupled to line Y of an electrical potential generator, is always coupled to either output terminal A or output terminal B of switching unit 366 and to either the + or G terminals of power supply 370. Each of these transmission gates selectively enables one of the + or G signals from power supply 370 to be communicated to node 414 in the electrical potential generator. However, line Y of electrical potential generators 305-308 and 317-320 are unconnected and therefore receive no independent signal. Thus, it is apparent that node 414 of each electrical potential generator 301-324 may be in one of three possible states: (1) node 418 is at a ground potential as a result of activation of one of output terminals A or B of switching unit 366; (2) node 414 is at a +7.5 volt potential as a result of activation of one of output terminals A or B of switching unit 366; or (3) node 414 operates independently of switching unit 366.

In the first case, the ground potential at node 414 forces transistor Q2 off and node 402 is maintained at VCC by the operation of transistor Q1. In the second case, the +7.5 volt potential at node 414 forces Q2 to be always on (and transistor Q1 always off), thus forcing node 402 to be at ground potential. From a review of FIGS. 1 and 2, it is apparent that electrodes 301-304 will be maintained at VCC when output terminal A of switching unit 366 is enabled, and electrodes 113-116 will be at a constant ground potential. Similarly, when output terminal B of switching unit is active, electrodes 109-112 will be at VCC, and electrodes 121-124 will be at a ground potential. Thus, line Y of electrical potential generators 301-304, 309-316, and 321-314 override the normal servo action of those electrical potential generators.

Because the function of signals applied to line Y is to override servo operation of the electrical potential generator, line Y of each electrical potential generator 305-308 land 317-320 is unconnected. This is because the electrodes connected to these electrical potential generators are never at VCC or ground potentials. Of course, the absolute orientations of the field are determined by the designer, so in some systems, the serving action of the electrical potential generators may be enabled or disabled, as required.

While the above is a complete description of a preferred embodiment of the present invention, various modifications may be employed. For example, the electrodes could be arranged to form any desired polygon, and power supplies 362 and 370 could be constructed as one unit. Additionally, voltage boosters may be coupled to the circuit at appropriate places to compensate for circuit losses. Consequently, the scope of the invention should not be limited except as properly described in the claims.

I claim:

1. A circuit for maintaining a DC voltage at a prescribed level comprising:
    oscillating means for generating a pulse train having a duty cycle;
    first converting means, coupled to the oscillating means, for converting the pulse train into a first DC voltage at a first node;
    second converting means, coupled to the first node, for converting the first DC voltage into a second DC voltage at a second node;
    comparing means, coupled to the second converting means, for comparing the second DC voltage to a prescribed voltage level;
    maintaining means, responsive to the comparing means, for maintaining the second DC voltage at the prescribed level by selectively causing the oscillating means to increase and decrease the duty cycle of the pulse train, the maintaining means comprising:
    a first transistor having an input terminal coupled to a current source and an output terminal coupled to the second node for flowing a current into the second node; and
    a second transistor having an input terminal coupled to the second node for flowing current away from the second node.

2. The circuit according to claim 1 wherein the maintaining means causes the first transistor to flow current into the second node when the second DC voltage falls below the prescribed voltage level and the maintaining means causes the second transistor to flow current away from the second node when the second DC voltage rises above the prescribed voltage level.

3. The circuit according to claim 2 wherein the oscillating means and the comparing means together comprise:
    a comparator having a first input terminal coupled to the second node and a second input terminal coupled to a reference voltage, the comparator including means for generating a positive signal at an output terminal thereof when the second DC voltage rises above the prescribed voltage level and for generating a negative signal at the output terminal when the second DC voltage falls below the prescribed voltage level.

4. The circuit according to claim 2 wherein the first converting means comprises:
    averaging means, coupled to the oscillating means, for providing a voltage which is an average of the voltages of the pulse train.

5. The circuit according to claim 4 wherein the averaging means comprises:
    a capacitance coupled to the oscillating means for receiving pulses therefrom.

6. The circuit according to claim 4 wherein the averaging means comprises:
    a resistance coupled to the oscillating means for receiving the pulse train therefrom; and
    a capacitance connected to the resistance.

7. The circuit according to claim 4 wherein the first and second transistors are coupled to the averaging means.

8. The circuit according to claim 7 wherein, in response to the averaging means, the first transistor selectively flows current into the second node and the second transistor selectively flows current away from the second node.

9. The circuit according to claim 8 wherein the first transistor includes a control terminal coupled to the second node for causing current to flow through the first transistor and into the second node when the second DC voltage falls below the prescribed voltage level.

10. The circuit according to claim 9 wherein the second transistor includes a control terminal, coupled to the averaging means, for causing current to flow through the second transistor and away from the second node when the second DC voltage rises above the prescribed voltage level.

11. The circuit according to claim 10 wherein the input terminal of the second transistor is coupled to the control terminal of the first transistor for inhibiting the operation of the first transistor when the second transistor flows current away from the second node.

12. The circuit according to claim 11 wherein the oscillating means and the comparing means together comprise:
    a comparator having a first input terminal coupled to the second node and a second input terminal coupled to a reference voltage, the comparator including means for generating a positive signal at an output terminal thereof when the second DC voltage rises above the prescribed voltage level and for generating a negative signal at the output terminal thereof when the second DC voltage falls below the prescribed voltage level.

13. The circuit according to claim 12 further comprising reference selecting means, coupled to the second input terminal of the comparator, for providing a selected reference voltage to the second input terminal of the comparator.

14. The circuit according to claim 13 wherein the reference selecting means comprises a potentiometer.

15. An apparatus for providing a homogeneous electric field comprising:
    a plurality of electrodes spaced apart from each other;
    a plurality of electrode drivers, each electrode driver being coupled to an associated one of the plurality of electrodes at a corresponding first node for communicating a first DC voltage to the associated electrode;
    first DC voltage selecting means for selecting a first DC voltage value; and
    wherein a selected one of the plurality of electrode drivers comprises first DC voltage generating means, coupled to the first DC voltage selecting means, for generating a first DC voltage proportional to the selected first DC voltage value, the first DC voltage generating means comprising:
oscillating means for generating a pulse train having a duty cycle;
first converting means, coupled to the oscillating means, for converting the pulse train into a second DC voltage at a second node;
second converting means, coupled to the first node, for converting the second DC voltage into the first DC voltage at the first node;
comparing means, coupled to the second converting means, for comparing the second DC voltage to a prescribed voltage level; and
maintaining means, responsive to the comparing means, for maintaining the first DC voltage at the prescribed level by selectively causing the oscillating means to increase and decrease the duty cycle of the pulse train, the maintaining means comprising:
a first transistor having an input terminal coupled to a current source and an output terminal coupled to the first node for flowing a current into the first node; and
a second transistor having an input terminal coupled to the first node for flowing current away from the first node.

16. The circuit according to claim 15 wherein the maintaining means causes the first transistor to flow current into the first node when the first DC voltage falls below the prescribed voltage level, and wherein the maintaining means causes the second transistor to flow current away from the first node when the first DC voltage rises above the prescribed voltage level.

17. The circuit according to claim 16 wherein the oscillating means and the comparing means together comprise:
a comparator having a first input terminal coupled to the first node and a second input terminal coupled to a reference voltage, the comparator including means for generating a positive signal at an output terminal thereof when the first DC voltage rises above the prescribed voltage level and for generating a negative signal at the output terminal when the first DC voltage falls below the prescribed voltage level.

18. The circuit according to claim 16 wherein the first converting means comprises:
averaging means, coupled to the oscillating means, for providing a voltage which is an average of the voltages of the pulse train.

19. The circuit according to claim 18 wherein the averaging means comprises:
a capacitance coupled to the oscillating means for receiving pulses therefrom.

20. The circuit according to claim 18 wherein the averaging means comprises:
a resistance coupled to the oscillating means for receiving the pulse train therefrom; and
a capacitance connected to the resistance.

21. The circuit according to claim 18 wherein the first and second transistors are coupled to the averaging means.

22. The circuit according to claim 21 wherein, in response to the averaging means, the first transistor selectively flows current into the first node and the second transistor selectively flows current away from the first node.

23. The circuit according to claim 22 wherein the first transistor includes a control terminal coupled to the first node for causing current to flow through the first transistor and into the first node when the first DC voltage falls below the prescribed voltage level.

24. The circuit according to claim 21 wherein the second transistor includes a control terminal, coupled to the averaging means, for causing current to flow through the second transistor and away from the first node when the first DC voltage rises above the prescribed voltage level.

25. The circuit according to claim 24 wherein the input terminal of the second transistor is coupled to the control terminal of the first transistor for decreasing the voltage to the control terminal of the first transistor when the second transistor flows current away from the first node.

26. The apparatus according to claim 25 wherein the plurality of electrodes comprise:
a first electrode disposed along a first axis;
a second electrode disposed along a second axis, the second axis being parallel to the first axis; and
a third electrode disposed between the first axis and the second axis.

27. The apparatus according to claim 26 wherein the electrode driver coupled to the third electrode is a selected one of the plurality of electrode drivers which generates the electrical potential having the selected first DC voltage value.

28. The circuit according to claim 27 wherein the oscillating means and the comparing means together comprise:
a comparator having a first input terminal coupled to the first node and a second input terminal coupled to a reference voltage, the comparator including means for generating a positive signal at an output terminal thereof when the first DC voltage rises above the prescribed voltage level and for generating a negative signal at the output terminal thereof when the first DC voltage falls below the prescribed voltage level.

29. The circuit according to claim 28 further comprising reference selecting means, coupled to the second input terminal of the comparator, for providing a selected reference voltage to the second input terminal of the comparator.

30. The circuit according to claim 29 wherein the reference selecting means comprises a potentiometer.

31. The apparatus according to claim 30 wherein the plurality of electrodes are arranged in the form of a closed polygon.

32. The apparatus according to claim 31 wherein the polygon is a hexagon.

33. A method for generating an electrical potential comprising the steps of:
generating a pulse train having a selectively variable duty cycle;
averaging the voltages of the pulse train for generating an average pulse train voltage;
varying the duty cycle of the pulse train for varying the average pulse train voltage;
coupling a control terminal of a first transistor for receiving the average pulse train voltage;
flowing a current from a node coupled to an input terminal of the first transistor to an output terminal of the first transistor when a voltage at the node is above a first prescribed value;

inhibiting a current flow from the node when the node voltage is below the first prescribed value;

coupling an input terminal of a second transistor to a current source;

coupling an output terminal of the second transistor to the node;

coupling the control terminal of the second transistor to the node; and flowing a current from the current source into the node when the second node voltage rises above the second prescribed value.

34. The method according to claim 33 further comprising the steps of:

increasing the duty cycle of the pulse train when the sensed node voltage falls below a second prescribed value; and decreasing the duty cycle of the pulse train when the sensed node voltage rises above the second prescribed value.

35. The method according to claim 34 further comprising the steps of:

inhibiting current flow into the node by the second transistor when the first transistor flows current away from the node.

36. A circuit for maintaining a DC voltage at a prescribed level comprising:

voltage generating means for generating a voltage at a first node;

comparing means, coupled to the first node, for comparing a voltage form the first node to a reference voltage, the comparing means generating a first signal when the voltage from the first node is above the reference voltage, and the comparing means generating a second signal when the voltage from the first node is below the reference voltage; and wherein the voltage generating means includes:

current sink means for flowing a current away from the first node in response to the first signal; and current source means for flowing a current into the first node in responses to the second signal.

37. The circuit according to claim 36 wherein:

when the current sink means flows current away from the first node, the voltage from the first node falls below the reference voltage; and when the current source means flows current into the second node, the voltage from the first node rises above the reference voltage;

so that the comparing means generates the first and second signals in an oscillating pulse train.

38. The circuit according to claim 37 further comprising averaging means, coupled to the comparator, for providing a voltage which is an average of the voltages of the pulse train.

39. The circuit according to claim 38 wherein the current source means and current sink means selectively flows current into and away from the first node in response to the average voltage.

40. The circuit according to claim 39 wherein the current source means flows current into the first node when the average voltage is below a selected value, and wherein the current sink flows current away from the first node when the average voltage is above the selected value.

41. The circuit according to claim 40 wherein the current source means comprises a first transistor having an input terminal coupled to a current source and an output terminal coupled to the first node for flowing current into the first node.

42. The circuit according to claim 41 wherein the current sink means comprises a second transistor having an input terminal coupled to the first node for flowing current away from the first node.

43. The circuit according to claim 42 wherein the second transistor has a control terminal coupled to the averaging means, the second transistor flowing current away from the first node when the average voltage rises above the selected value.

44. The circuit according to claim 43 wherein the first transistor has a control terminal coupled to the input terminal of the second transistor, so that the first transistor flows current into the first node when the average voltage falls below the selected value.

45. The circuit according to claim 44 further comprising unidirectional current flow means having an input terminal coupled to the first node and an output terminal coupled to both the control terminal of the first transistor and the input terminal of the second transistor, for providing current from the first node in one direction to the control terminal of the first transistor and to the input terminal of the second transistor.

46. The circuit according to claim 44 wherein the first signal is a positive signal, and wherein the second signal is a negative signal.

47. An apparatus for providing a homogeneous electric field comprising:

a plurality of electrodes spaced apart from each other;

a plurality of electrode drivers each electrode driver being coupled to an associated one of the plurality of electrodes for communicating a first DC voltage to the associated electrode;

wherein a selected one of the plurality of electrode drivers comprises:

voltage generating means for generating a voltage at a first node;

comparing means, coupled to the first node, for comparing a voltage from the first node to a reference voltage, the comparing means generating a first signal when the voltage from the first node is above the reference voltage, and the comparing means generating a second signal when the voltage from the first node is below the reference voltage; and wherein the voltage generating means includes:

current sink means for flowing a current away from the first node in response to the first signal; and current source means for flowing a current into the first node in responses to the second signal.

48. The circuit according to claim 47 wherein:

when the current sink means flows current away from the first node, the voltage from the first node falls below the reference voltage; and when the current source means flows current into the second node; the voltage from the first node rises above the reference voltage;

so that the comparing means generates the first and second signals in an oscillating pulse train.

49. The circuit according to claim 48 further comprising averaging means, coupled to the comparator, for providing a voltage which is an average of the voltages of the pulse train.

50. The circuit according to claim 49 wherein the current source means and current sink means selectively flow current into and away from the first node in response to the average voltage.

51. The circuit according to claim 50 wherein the current source means flows current into the first node when the average voltage is below a selected value, and wherein the current sink flows current away from the first node when the average voltage is above the selected value.

52. The circuit according to claim 51 wherein the current source means comprises a first transistor having an input terminal coupled to a current source and an output terminal coupled to the first node for flowing current into the first node.

53. The circuit according to claim 52 wherein the current sink means comprises a second transistor having an input terminal coupled to the first node for flowing current away from the first node.

54. The circuit according to claim 53 wherein the second transistor has a control terminal coupled to the averaging means, the second transistor flowing current away from the first node when the average voltage rises above the selected value.

55. The circuit according to claim 53 wherein the first transistor has a control terminal coupled to the input terminal of the second transistor, so that the first transistor flow current into the first node when the average voltage falls below the selected value.

56. The circuit according to claim 55 further comprising unidirectional current flow means having an input terminal coupled to the first node and an output terminal coupled to both the control terminal of the first transistor and the input terminal of the second transistor, for providing current from the first node in one direction to the control terminal of the first transistor and to the input terminal of the second transistor.

57. The circuit according to claim 55 wherein the first signal is a positive signal, and wherein the second signal is a negative signal.

* * * * *